(12) United States Patent
Pendharkar

(10) Patent No.: US 7,176,091 B2
(45) Date of Patent: Feb. 13, 2007

(54) DRAIN-EXTENDED MOS TRANSISTORS AND METHODS FOR MAKING THE SAME

(75) Inventor: Sameer Pendharkar, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/082,166

(22) Filed: Mar. 16, 2005

(65) Prior Publication Data

US 2006/0001086 A1  Jan. 5, 2006

Related U.S. Application Data

(62) Division of application No. 10/880,907, filed on Jun. 30, 2004.

(51) Int. Cl.
*H01L 21/336* (2006.01)

(52) U.S. Cl. .................. 438/282; 438/305; 438/306; 438/307

(58) Field of Classification Search ............ 438/282, 438/305–307
See application file for complete search history.

(56) References Cited

U.S. PATENT DOCUMENTS

| | | | | |
|---|---|---|---|---|
| 5,455,447 | A | * | 10/1995 | Hutter et al. ............... 257/545 |
| 5,847,440 | A | * | 12/1998 | Yamamoto .................. 257/525 |
| 5,852,314 | A | | 12/1998 | Depetro et al. |
| 5,976,942 | A | | 11/1999 | Ludikhuize |
| 6,211,552 | B1 | | 4/2001 | Efland et al. |
| 6,288,424 | B1 | * | 9/2001 | Ludikhuize .................. 257/335 |
| 6,376,891 | B1 | | 4/2002 | Nagatani et al. |
| 6,395,593 | B1 | * | 5/2002 | Pendharkar et al. ........ 438/207 |
| 6,475,870 | B1 | | 11/2002 | Huang et al. |
| 6,531,355 | B2 | | 3/2003 | Mosher et al. |
| 6,548,874 | B1 | | 4/2003 | Morton et al. |
| 6,570,229 | B1 | * | 5/2003 | Harada ....................... 257/373 |
| 6,593,621 | B2 | * | 7/2003 | Tsuchiko et al. ........... 257/335 |
| 6,729,886 | B2 | | 5/2004 | Efland et al. |
| 6,734,493 | B2 | | 5/2004 | Chen et al. |
| 2002/0053695 | A1 | | 5/2002 | Liaw et al. |

OTHER PUBLICATIONS

U.S. Appl. No. 10/890,648, filed Jul. 14, 2004, Pendharkar.

* cited by examiner

*Primary Examiner*—Douglas W. Owens
*Assistant Examiner*—Samuel A. Gebremariam
(74) *Attorney, Agent, or Firm*—Rose Alyssa Keagy; W. James Brady; Frederick J. Telecky, Jr.

(57) ABSTRACT

Drain-extended MOS transistors (T1, T2) and semiconductor devices (102) are described, as well as fabrication methods (202) therefor, in which a p-buried layer (130) is formed prior to formation of epitaxial silicon (106) over a substrate (104), and a drain-extended MOS transistor (T1, T2) is formed in the epitaxial silicon layer (106). The p-buried layer (130) may be formed above an n-buried layer (120) in the substrate (104) for high-side driver transistor (T2) applications, wherein the p-buried layer (130) extends between the drain-extended MOS transistor (T2) and the n-buried layer (120) to inhibit off-state breakdown between the source (154) and drain (156).

1 Claim, 9 Drawing Sheets

DRAIN-EXTENDED MOS TRANSISTORS AND METHODS FOR MAKING THE SAME

This is a division of application Ser. No. 10/880,907, filed Jun. 30, 2004.

FIELD OF INVENTION

The present invention relates generally to semiconductor devices and more particularly to extended-drain MOS transistor devices and fabrication methods for making the same.

BACKGROUND OF THE INVENTION

Power semiconductor products are often fabricated using N or P channel drain-extended metal-oxide-semiconductor (DEMOS) transistor devices, such as lateral diffused MOS (LDMOS) devices or RESURF transistors, for high power switching applications. DEMOS devices advantageously combine short-channel operation with high current handling capabilities, relatively low drain-to-source on-state resistance (Rdson), and the ability to withstand high blocking voltages without suffering voltage breakdown failure. Breakdown voltage is typically measured as drain-to-source breakdown voltage with the gate and source shorted together (BVdss), where DEMOS device designs often involve a tradeoff between breakdown voltage BVdss and Rdson. In addition to performance advantages, DEMOS device fabrication is relatively easy to integrate into CMOS process flows, facilitating use in devices where logic, low power analog, or other circuitry is also to be fabricated in a single integrated circuit (IC).

N-channel drain-extended transistors (DENMOS) are asymmetrical devices often formed in an n-well with a p-well (e.g., sometimes referred to as a p-body) formed in the n-well. An n-type source is formed within the p-well, where the p-well provides a p-type channel region between the source and an extended n-type drain. The extended drain typically includes an n-type drain implanted within the n-well, and a drift region in the n-well extending between the channel region and the drain. Low n-type doping on the drain side provides a large depletion layer with high blocking voltage capability, wherein the p-well is typically connected to the source by a p-type back-gate connection to prevent the p-well from floating, thereby stabilizing the device threshold voltage (Vt). The device drain region is spaced from the channel (e.g., extended) to provide a drift region or drain extension in the n-type semiconductor material therebetween. In operation, the spacing of the drain and the channel spreads out the electric fields, thereby increasing the breakdown voltage rating of the device (higher BVdss). However, the drain extension increases the resistance of the drain-to-source current path (Rdson), whereby DEMOS device designs often involve a tradeoff between high breakdown voltage BVdss and low Rdson.

DEMOS devices have been widely used for power switching applications requiring high blocking voltages and high current carrying capability, particularly where a solenoid or other inductive load is to be driven. In one common configuration, two or four n-channel DEMOS (DENMOS) devices are arranged as a half or full "H-bridge" circuit to drive an inductive load. In a half H-bridge arrangement, two DENMOS transistors are coupled in series between a supply voltage VCC and ground with a load coupled from an intermediate node between the two transistors to ground. In this configuration, the transistor between the intermediate node and ground is referred to as the "low-side" transistor and the other transistor is a "high-side" transistor, wherein the transistors are alternatively activated to provide current to the load. In a full H-bridge driver circuit, two high-side drivers and two low-side drivers are provided, with the load being coupled between two intermediate nodes.

In operation, the high-side DENMOS has a drain coupled with the supply voltage and a source coupled to the load. In an "on" state, the high-side driver conducts current from the supply to the load, wherein the source is essentially pulled up to the supply voltage. Typical DENMOS devices are fabricated in a wafer having a p-doped silicon substrate with an epitaxial silicon layer formed over the substrate, where the substrate is grounded and the transistor source, drain, and channel (e.g., including the n-well and the p-well) are formed in the epitaxial silicon. In the on-state for the high-side DENMOS device, therefore, it is desirable to separate the p-well that surrounds the source from the underlying p-type substrate that is grounded, to prevent punch-thru current between the p-well and the substrate. Although the n-well may extend under the p-well, the n-well is typically only lightly doped, and therefore does not provide an adequate barrier to on-state punch-thru current from the source to the substrate. Accordingly, a heavily doped n-buried layer (e.g., NBL) is sometimes formed in the substrate prior to forming the epitaxial silicon layer to separate the n-well from the substrate, and to thereby inhibit on-state punch-thru current from the p-well to the substrate in high-side DENMOS drivers. The n-buried layer may be connected by a deep diffusion or sinker to the drain terminal in such high-side DENMOS devices, and hence is tied to the supply voltage so as to prevent or inhibit on-state punch-thru currents.

Although the n-buried layer operates to prevent on-state punch-thru current, the NBL limits the off-state breakdown voltage rating of high-side DENMOS drivers. In an "off" state, the high-side driver source is essentially pulled to ground while the low-side driver is conducting, wherein the drain-to-source voltage across the high-side DENMOS is essentially the supply voltage VCC. In high voltage switching applications, the presence of the n-buried layer under the p-well limits the drain-to-source breakdown of the device, since the n-buried layer is tied to the drain at VCC. In this situation, the p-well is at ground, since the source is low in the off-state, and the supply voltage VCC is essentially dropped across the n-well portion extending between the bottom of the p-well and the n-buried layer, and between the channel-side of the p-well and the drain. Furthermore, as the high-side driver is shut off when driving an inductive load, the transient drain-to-source voltage may increase beyond the supply voltage level VCC.

In these situations, the lateral spacing of the drain from the p-well may be adjusted to prevent p-well to drain breakdown. However, the vertical spacing between the bottom of the p-well and the n-buried layer is more difficult to increase. One approach is to increase the thickness of the epitaxial silicon layer. However, this is costly in terms of process complexity, particularly in forming the deep diffusions to connect the n-buried layer to the drain. Accordingly, there is a need for improved DEMOS devices and fabrication methods by which increased voltage breakdown withstanding capabilities can be achieved, without increasing epitaxial silicon thicknesses and without sacrificing device performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The present invention relates to drain-extended MOS (DEMOS) transistors and fabrication methods in which a p-buried layer is formed in a substrate prior to epitaxial silicon formation, and a drain-extended MOS transistor is formed in the epitaxial silicon layer, to facilitate higher breakdown voltage ratings without requiring thicker epitaxial silicon layers.

One aspect of the invention provides a drain-extended MOS transistor, comprising an n-doped source formed in a semiconductor body, an n-doped drain laterally spaced from the source in the semiconductor body, an n-doped drift region, and a p-doped channel region in the semiconductor body. The channel region extends in the semiconductor body between the drift region and the source, and the drift region extends between the channel and the drain. The transistor further comprises a gate located above the channel region, and a p-doped buried layer located below the source, the channel region, and the drift region. In one example, the semiconductor body comprises a silicon substrate and an overlying epitaxial silicon layer, where the source, drain, channel region, and drift region are located in the epitaxial silicon layer, with at least a portion of the p-doped buried layer being located in the substrate. For high side devices, an n-buried layer can be formed in the substrate prior to forming the p-buried layer, wherein the p-buried layer is situated between the transistor and the n-buried layer to improve the off-state and/or transient breakdown voltage performance.

Another aspect of the invention provides a semiconductor device, comprising a semiconductor body, a drain-extended NMOS transistor formed in the semiconductor body, and a p-doped buried layer below the drain-extended NMOS transistor in the semiconductor body. The device may further comprise an n-buried layer located below at least a portion of the p-doped buried layer. Yet another aspect of the invention provides a method for fabricating a semiconductor device. The method comprises providing a silicon substrate, implanting a p-buried layer in the silicon substrate, forming an epitaxial silicon layer over the silicon substrate after implanting the p-buried layer, and forming a drain-extended NMOS transistor above the p-buried layer in the epitaxial silicon layer.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
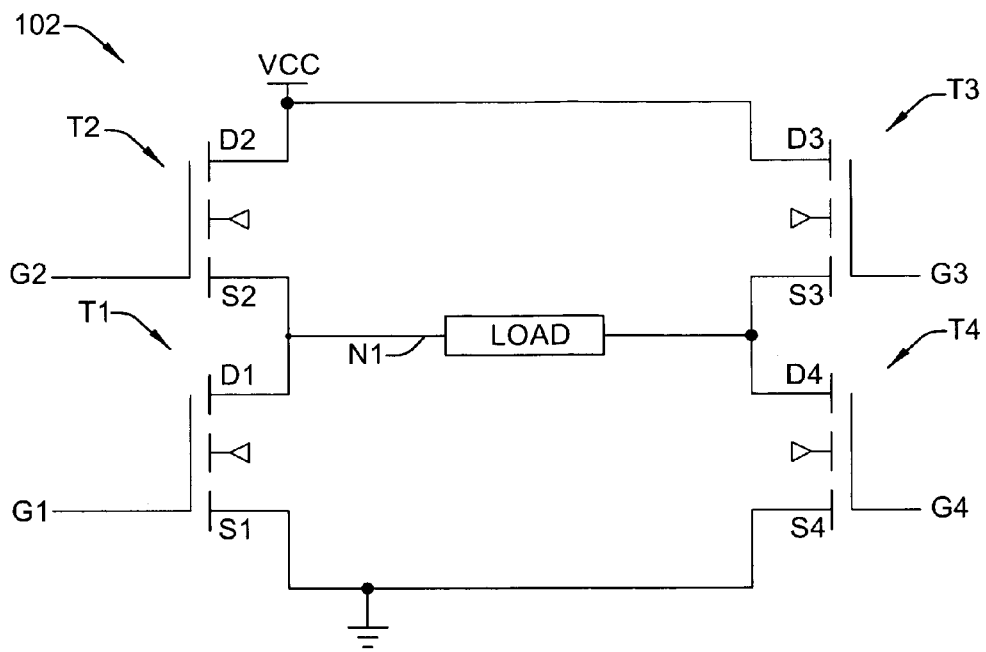
FIG. 1 is a schematic diagram illustrating a full H-bridge circuit device for driving a load using two pairs of low and high-side drain-extended NMOS devices in which one or more aspects of the invention may be implemented.

One or more implementations of the present invention will now be described with reference to the attached drawings, wherein like reference numerals are used to refer to like elements throughout, and wherein the illustrated structures are not necessarily drawn to scale. The invention provides drain-extended MOS (DEMOS) transistors and fabrication methods therefor, in which a p-buried layer is formed prior to epitaxial silicon formation over a substrate, and a drain-extended MOS transistor is formed in the epitaxial silicon layer. The p-buried layer may be formed above an n-buried layer in the substrate for high-side driver transistor applications, wherein the p-buried layer extends between the drain-extended MOS transistor and the n-buried layer to inhibit off-state or transient breakdown between the source and drain without increasing the thickness of an epitaxial silicon layer, while allowing the n-buried layer to inhibit on-state punch-thru currents between the body and the substrate.

In order to appreciate various advantages of the invention and shortcomings of conventional DEMOS devices, FIG. 1 illustrates a full H-bridge driver semiconductor device 102 powered by a DC supply voltage VCC, in which various aspects of the invention may be implemented. The device 102 includes four DENMOS devices T1–T4 having corresponding sources S1–S4, drains D1–D4, and gates G1–G4, respectively, coupled in an H-bridge to drive an inductive load. The transistors T1–T4 are arranged as two pairs of low and high-side drivers (T1 & T2, and T4 & T3) with the load coupled between the intermediate nodes of the two pairs, thereby forming an "H-shaped" circuit. A half-bridge driver circuit could be implemented using T1 and T2, with the right hand node of the load being coupled to ground, wherein T3 and T4 would be omitted. The supply voltage VCC can be a positive terminal of a battery source and the ground may be the battery negative terminal in applications for portable electronic devices, etc.

On the left side of the H-bridge in FIG. 1, a low-side driver T1 and a high-side driver T2 are coupled in series between the supply voltage VCC and ground, and the other pair T4 and T3 are similarly connected. The high side driver transistor T2 has a drain D2 coupled to VCC and a source S2 coupled with an intermediate node N1 at the load. The low-side transistor T1 has a drain D1 coupled to the node N1 and a source S1 coupled to ground. The node N1 between the transistors T1 and T2 is coupled to a first terminal of a load and the other load terminal is coupled to the other transistor pair T3 and T4, wherein the load is typically not a part of the device 102. The high and low side transistor gates G1–G4 are controlled so as to drive the load in alternating fashion. When the transistors T2 and T4 are on, current flows through the high-side transistor T2 and the load in a first direction (to the right in FIG. 1), and when the transistors T3 and T1 are both on, current flows through the load and the low-side transistor T1 in a second opposite direction.

Figure 2A:
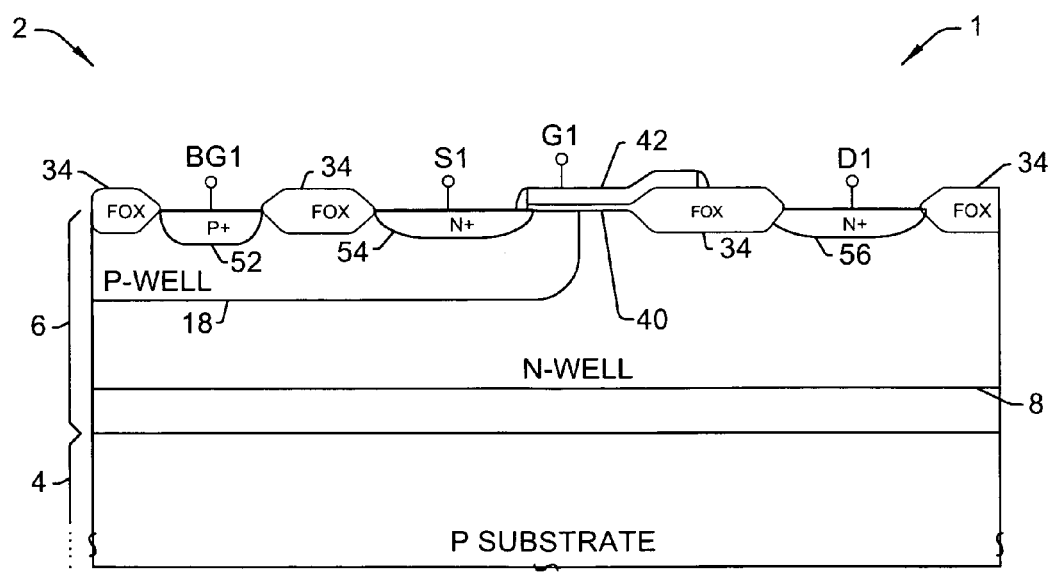
FIGS. 2A and 2B are partial side elevation views in section illustrating conventional low and high-side DENMOS transistors, respectively.
Figure 2B:
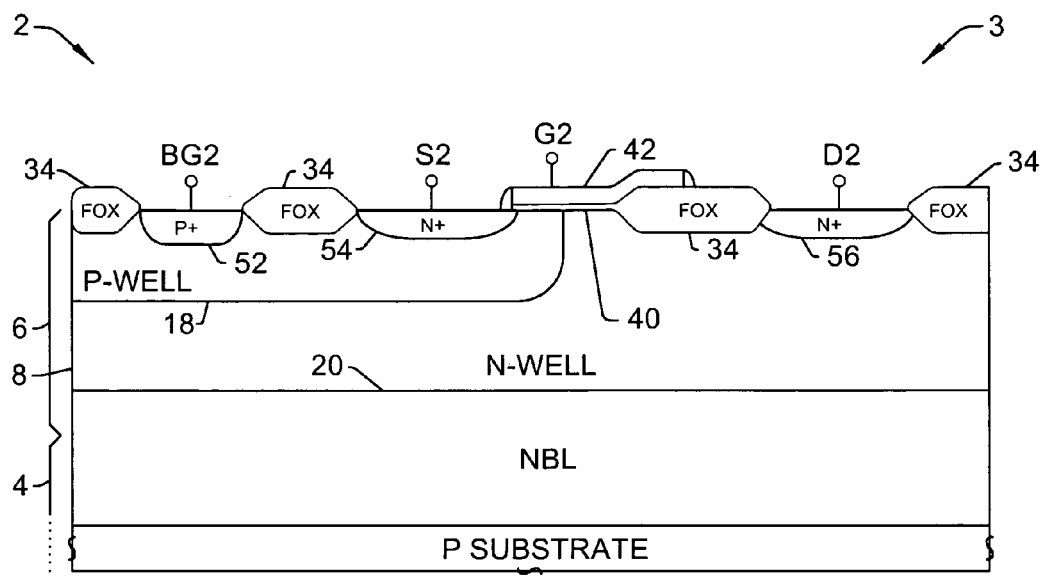
Figure 2C:
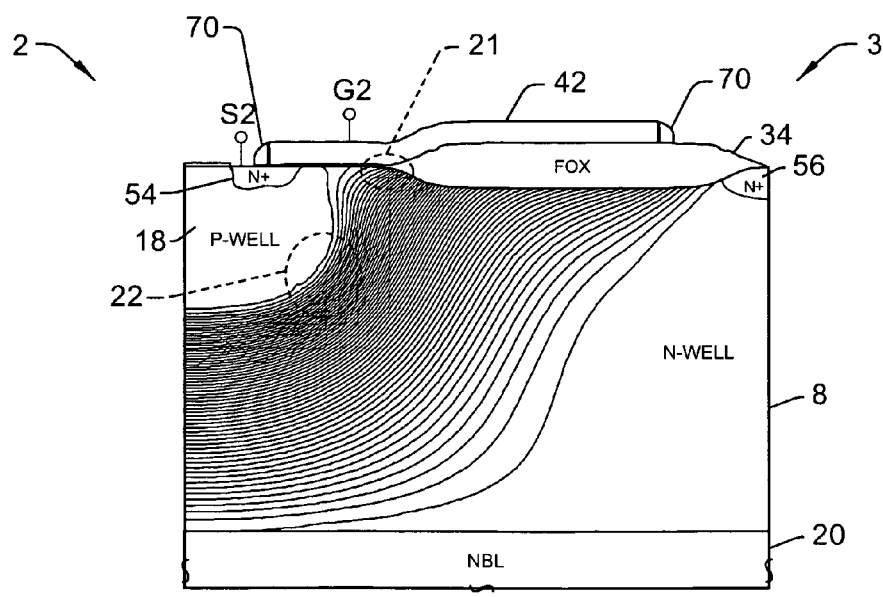
FIG. 2C is a side elevation view of the conventional high-side transistor of FIG. 2B, illustrating equipotential voltage lines in the drift region and areas prone to breakdown at high voltages in an off-state.

FIGS. 2A–2C illustrate a semiconductor device 2 with conventional low and high-side DENMOS transistors 1 and 3 of FIGS. 2A and 2B, respectively, as well as breakdown voltage limitations (FIG. 2C) thereof, which are briefly described hereinafter in the context of H-bridge driver circuits to facilitate an appreciation the possible advantages of the present invention, wherein the DENMOS transistors 1 and 3 can be coupled to drive a load in a full or half-bridge driver circuit configuration, such as the H-bridge circuit of FIG. 1. The device 2 includes a p-doped silicon substrate 4 over which an epitaxial silicon layer 6 is formed. An n-buried layer (NBL) 20 is formed in the substrate 4 beneath the high-side device 3 of FIG. 2B and extends partially into the epitaxial silicon 6. An n-well 8 is implanted with n-type dopants in the epitaxial silicon 6, and a p-well or p-body 18 is formed within the n-well 8. Field oxide isolation structures 34 are formed in the upper portion of the epitaxial silicon 6 between transistor device terminals of the low and high side transistors 1 and 3.

As illustrated in FIGS. 2A and 2B, the DENMOS transistors 1 and 3 each include a p-type back gate 52 and an n-type source 54 formed in the p-well 18, as well as an n-type drain 56 formed in the n-well 8. Gate structures are formed over a channel portion of the p-well 18, including a gate oxide 40 and a gate contact or electrode 42, wherein the gates G1, G2, sources S1, S2, and drains D1, D2 of the conventional low and high-side DENMOS transistors 1 and 3, respectively, are labeled as if coupled to form a half bridge as in FIG. 1 above for illustrative purposes. In such a driver application, the drain D2 of the high-side DENMOS 3 is connected to the supply voltage VCC and the source S2 is coupled to the load at the intermediate node N1. When the high side transistor 3 is on, both the source and drain are at or near the supply voltage VCC, wherein the n-buried layer 20 helps to prevent punch-thru current from flowing between the p-well 18 and the grounded p-type substrate 4, wherein the n-buried layer 20 is tied to the drain 56 (e.g., to VCC).

However, as discussed above, the n-buried layer 20 limits the off-state breakdown voltage rating of the conventional high-side DENMOS transistor 3, as further illustrated in FIG. 2C. When the high-side transistor 3 is off, the source S2 is essentially pulled to ground via the low-side transistor 1, whereby the drain-to-source voltage across the high-side DENMOS 3 is essentially the supply voltage VCC. Moreover, as the high-side device 3 is initially turned off, the transient drain-to-source voltage may increase beyond VCC, depending upon the load driven by the device. FIG. 2C illustrates equipotential voltage lines in the drift region of the n-well 8 in the high-side transistor 3 in the off-state. At high drain-to-source voltage levels, high electric fields are generated in regions 21 and 22, at which the equipotential lines are closely spaced, wherein FIG. 2C illustrates the high-side driver 3 at a drain-to-source voltage Vds just below the breakdown level.

The inventor has appreciated that these regions 21 and 22 are susceptible to breakdown at higher supply voltages in the high-side driver off-state due to the presence of the n-buried layer 20, wherein the breakdown voltage BVdss of the illustrated conventional device 3 is less than about 60 volts. Thus, while the n-buried layer 20 inhibits on-state punch-thru current from the p-well 18 to the substrate 4, the off-state breakdown voltage BVdss of the high-side driver 3 is limited by the NBL 20. In this regard, the inventor has appreciated that the n-buried layer 20 contributes to the equipotential line crowding of FIG. 2C at high drain-to-source voltage levels, particularly in the regions 21 and 22. Absent design changes, the supply voltage VCC cannot be increased. One approach is to decrease the dopant concentration of the n-well 8 for improved breakdown voltage performance. However, this approach adversely impacts the on-state drive current by increasing Rdson. Another approach is to increase the thickness of the epitaxial silicon layer 6. However, as discussed above, fabricating a thicker epitaxial layer 6 causes process complications, and may not be feasible beyond a certain amount.

The present invention provides semiconductor devices and DENMOS transistors that provide improved breakdown voltage ratings without increasing Rdson or the epitaxial silicon layer thickness. The invention thus facilitates use of such devices in new applications requiring higher supply voltages, including but not limited to full or half H-bridge configurations as in FIG. 1, while avoiding or mitigating the usual tradeoff between Rdson and BVdss in drain-extended MOS devices. FIGS. 3A–3D illustrate exemplary DENMOS transistors T1 and T2, respectively, comprising p-buried layers (PBL) 130 according to the invention in the driver device 102 of FIG. 1. FIG. 4 illustrates an exemplary method 202 for fabricating a semiconductor device and DENMOS transistors in accordance with the invention, and FIGS. 5A–5G illustrate the exemplary semiconductor device 102 at various stages of fabrication generally in accordance with the method 202 of FIG. 4.

Referring now to FIGS. 3A–3D, FIGS. 3A and 3B illustrate exemplary n-channel low and high-side drain-extended LDMOS (DENMOS) transistors T1 and T2, respectively, in the driver device 102 of FIG. 1, wherein the devices T4 and T3 of FIG. 1 may be similarly constructed in applications requiring a full H-bridge driver circuit. While the DENMOS transistors T1 and T2 are illustrated and described hereinafter in the context of the driver circuit of FIG. 1, the drain-extended transistors of the invention are not limited to such applications. Furthermore, the various aspects of the invention may be alternatively implemented in association with other drain-extended MOS transistors, such as RESURF devices, etc., and all such alternate applications and implementations are contemplated as falling within the scope of the present invention and the appended claims.

Figure 3A:
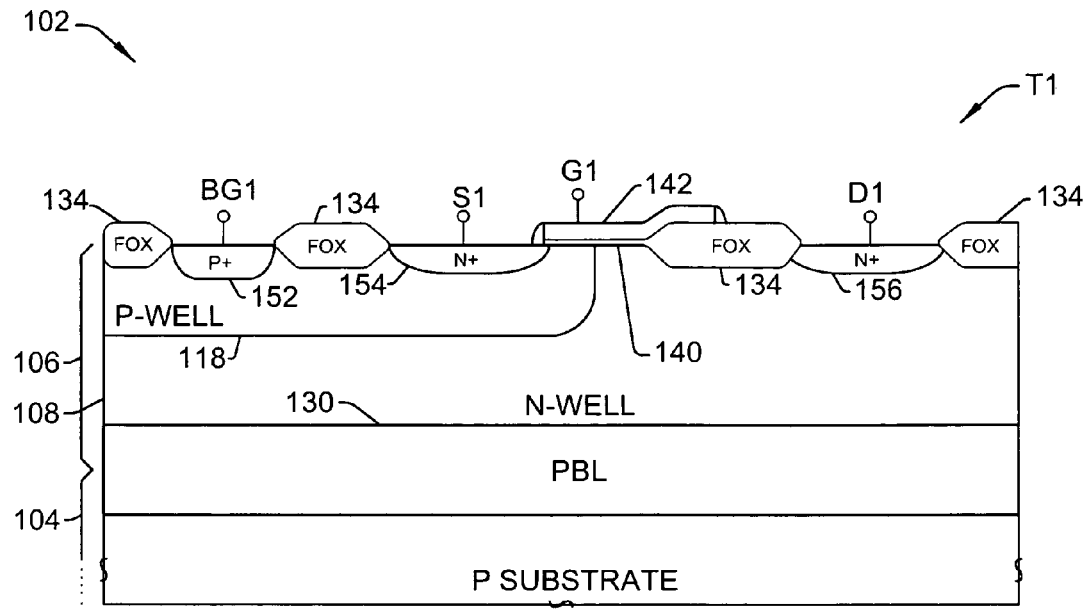
FIGS. 3A and 3B are partial side elevation views in section illustrating exemplary low and high-side DENMOS transistors with a p-buried layer in accordance with one or more aspects of the present invention.
Figure 3B:
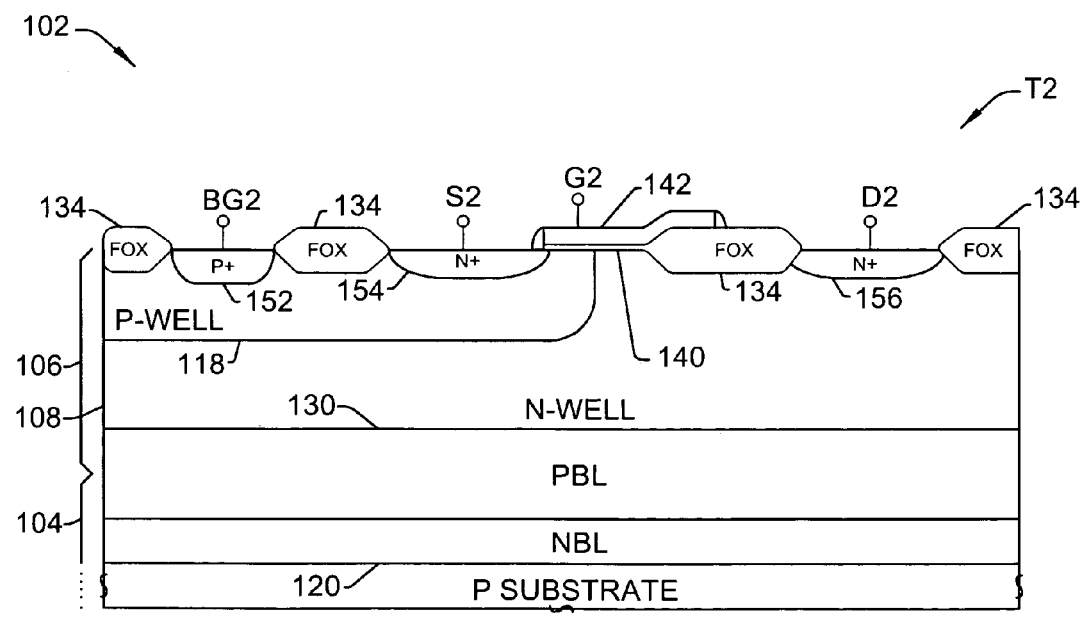
Figure 3C:
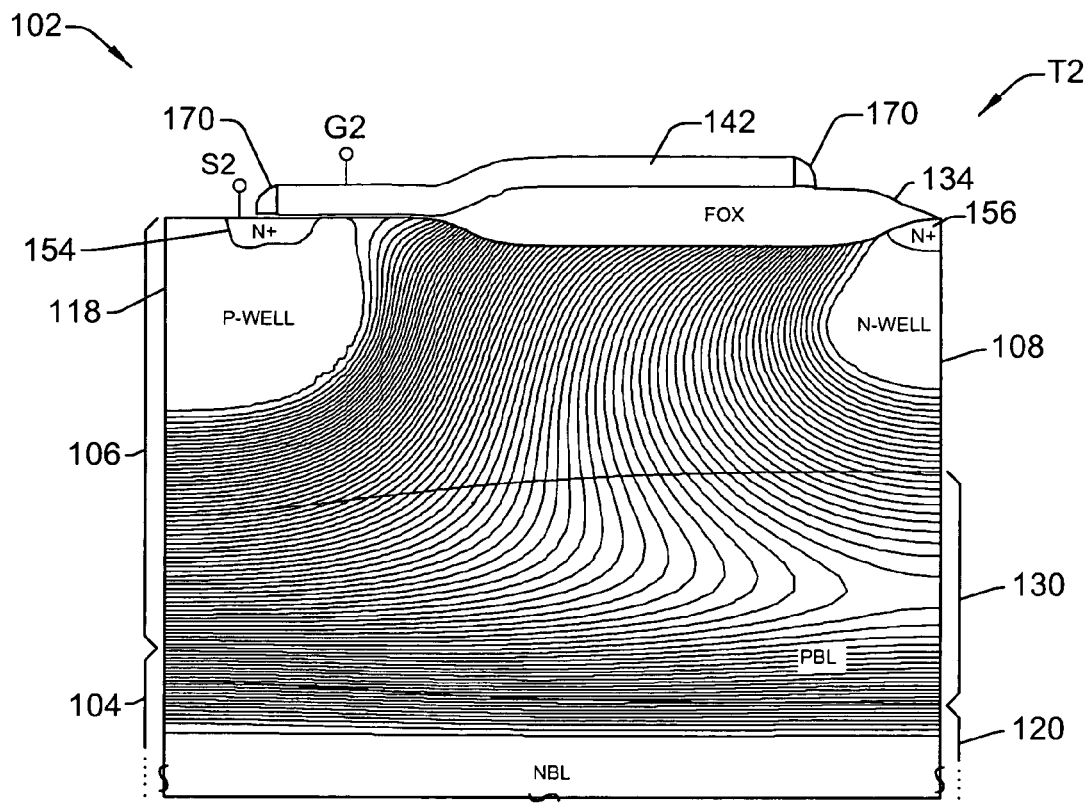
FIG. 3C is a side elevation view of the high-side DENMOS transistor of FIG. 3B, illustrating equipotential voltage lines in the drift region in an off-state.
Figure 4:
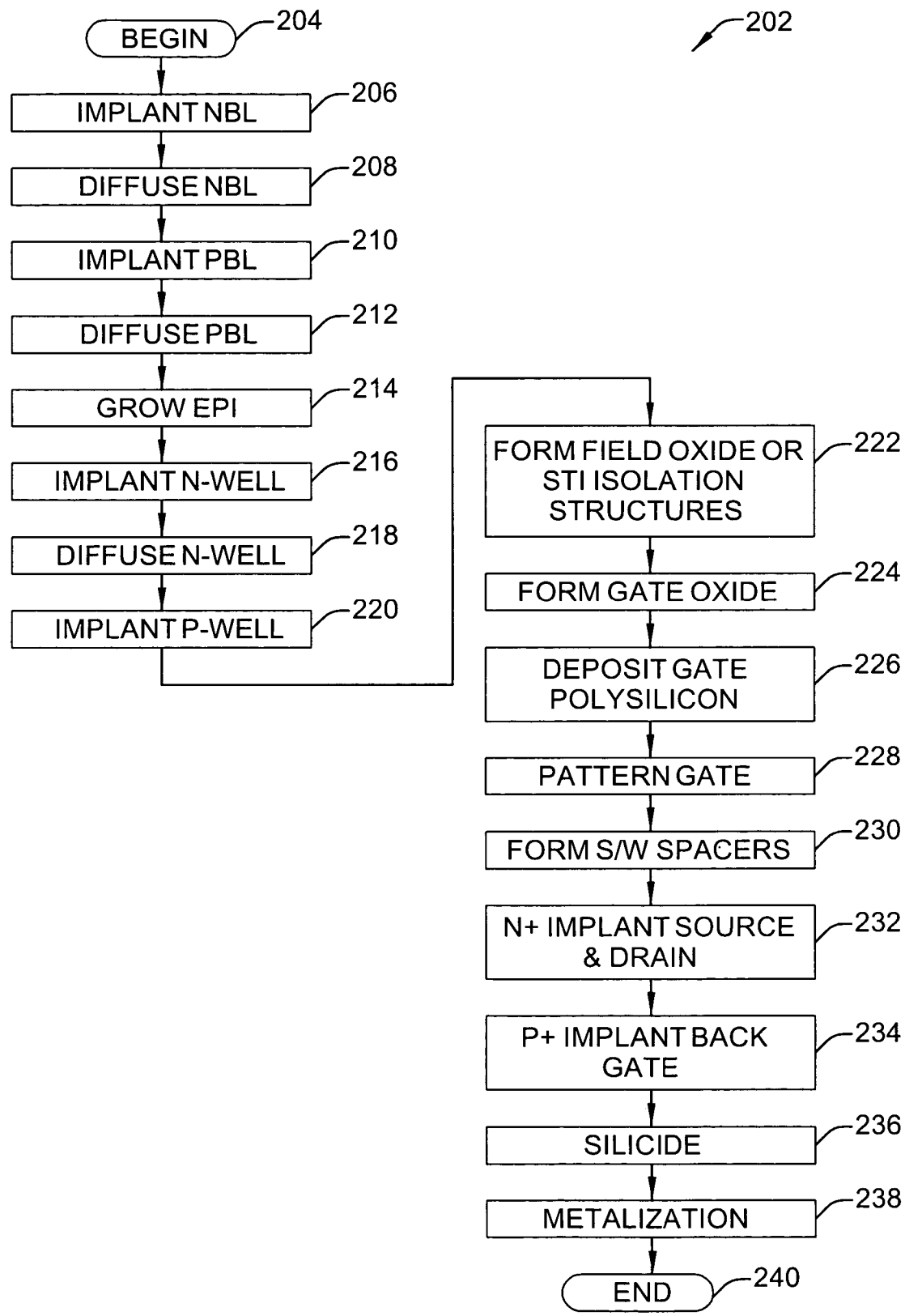
FIG. 4 is a flow diagram illustrating an exemplary method of fabricating a semiconductor device and DENMOS transistors thereof in accordance with the invention.

As illustrated in FIGS. 3A and 3B, the device 102 is formed in a semiconductor body comprising a p-doped silicon substrate 104 and an epitaxial silicon layer 106 formed over the substrate 104. Prior to formation of the epitaxial silicon 106, an n-buried layer (NBL) 120 is formed (e.g., implanted and diffused) in the substrate 104 beneath a prospective high-side driver region thereof, and a p-buried layer (PBL) 130 is formed (e.g., implanted) in the n-buried layer of the high-side driver region as well as in a prospective low-side driver region. Thus, the p-buried layer 130 is located between the n-buried layer 120 and the overlying high-side DENMOS transistor T2, as illustrated in FIG. 3B, wherein some of the implanted p-type dopants of the p-buried layer 130 may diffuse upward into the epitaxial silicon 106 during epitaxial growth thereof and/or during subsequent fabrication processing steps in which thermal energy is provided to the device 102. In this regard, the p-buried layer 130 may prevent or inhibit upward diffusion of n-type dopants of the n-buried layer 120 in the high-side device T2 during such thermal processing. FIG. 3C illustrates the high-side device T2 in an off-state, wherein the most of the supply voltage VCC is applied between the source and drain in the H-bridge circuit application of FIG. 1.

In the exemplary device 102, the p-buried layer 130 extends partially into the epitaxial silicon 106, with the remainder being located in the underlying substrate 104, although this is not a strict requirement of the invention. The exemplary transistors T1 and T2 of the device 102 each comprise an n-well 108 implanted with n-type dopants (e.g., arsenic, phosphorus, etc.) in the epitaxial silicon 106, as well as a p-well or p-body 118 formed within the n-well 108, where field oxide (FOX) isolation structures 134 are formed in the upper portion of the epitaxial silicon 106 between transistor source, drain, and back gate terminals. Other implementations are possible, for example, where the back gates may be connected directly to the sources, where the isolation structures are formed using shallow trench isolation (STI) techniques, etc., wherein all such alternative implementations having a p-buried layer formed under a drain-extended MOS transistor are contemplated as falling within the scope of the invention and the appended claims.

As illustrated in FIGS. 3A and 3B, the exemplary DENMOS transistors T1 and T2 are LDMOS types, which are generally similar to one another except that the high-side transistor T2 includes an n-buried layer 120 generally beneath the p-buried layer 130, while the low side transistor T1 does not. The transistors T1 and T2 individually comprise a p-type back gate 152 and an n-type source 154 formed in the p-well 118, as well as an n-type drain 156 formed in the n-well 108. In operation, the back gate 152 may, but need not, be coupled to the source 154 in an overlying metalization layer (not shown). In one possible alternative implementation, the field oxide (FOX) structure 134 between the back gate 152 and the source 154 may be omitted for direct connection of the back gate 152 to the source 154.

A gate structure is formed over a channel portion of the p-well 118 and over a portion of a drift region of the n-well 108, including a gate oxide 140 and a gate contact or electrode 142, where a portion of the gate electrode 142 is further extended over a field oxide structure 134 above the drain extension or drift region of the n-well 108. In a half or full H-bridge load driver configuration, the drain D2 of the high-side DENMOS T2 is connected to the supply voltage VCC together with the n-buried layer 120, and the source S2 thereof is coupled to the load at the intermediate node N1 in FIG. 1. In the on-state of the high side DENMOS transistor T2, the source 154 is pulled to near the supply voltage VCC, wherein the n-buried layer 120 helps to prevent punch-thru current from flowing between the p-well 118 and the grounded p-type substrate 104.

Figure 3D:
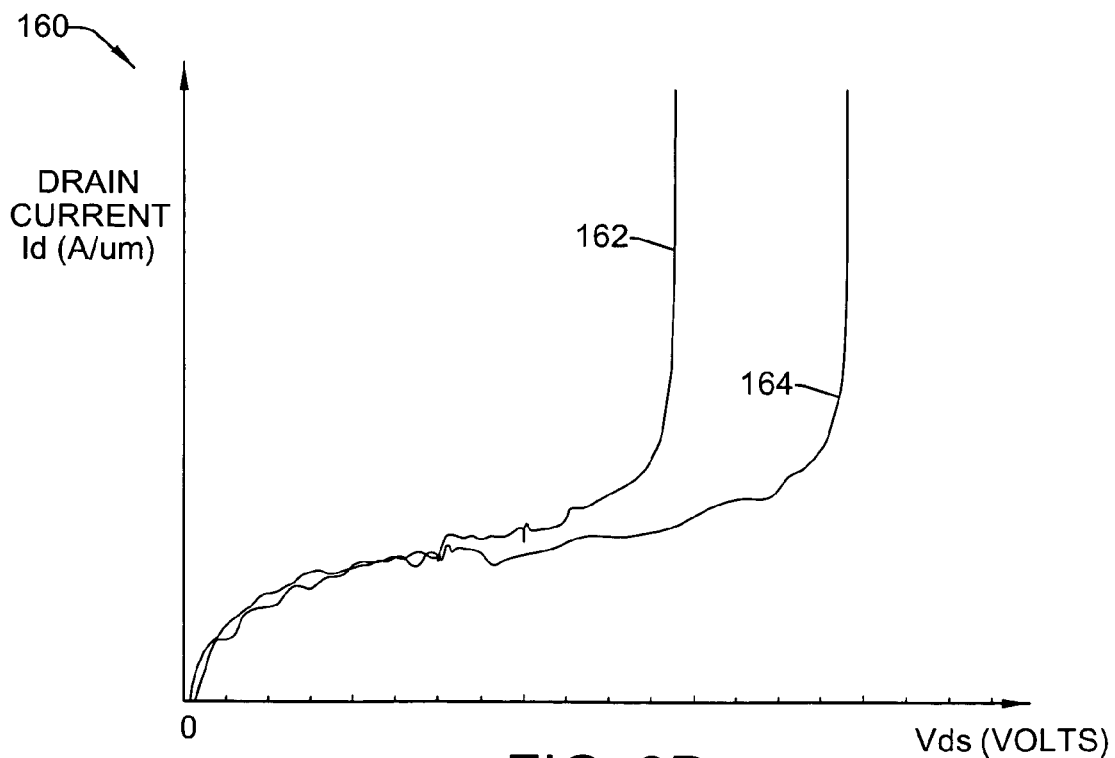
FIG. 3D is a graph comparing drain current (Id) vs. drain-to-source voltage (Vds) performance for the high side transistors of FIGS. 2B and 3B.

Referring now to FIGS. 3B–3D, in the off-state, practically all of the supply voltage VCC is dropped between the source 154 and drain 156 of the high-side DENMOS T2. FIG. 3C illustrates the high-side device T2 in an off-state for a supply voltage VCC about 30 percent higher than that of FIG. 2C above without breakdown, wherein the design parameters (e.g., dimensions, dopant concentrations, etc.) of the exemplary high-side DENMOS transistor T2 are essentially the same as the conventional high-side DENMOS 3 of FIG. 2B, with the addition of the p-buried layer 130. Thus, the addition of the p-buried layer 130 in the high-side DENMOS device T2 allows operation at higher supply voltages VCC without suffering off-state voltage breakdown, wherein BVdss is significantly increased without increasing the epitaxial silicon thickness, and without changing Rdson.

In a preferred implementation, the dopant concentration of the n-buried layer 120 is higher than that of the p-buried layer 130, so as to inhibit on-state punch-thru current from flowing between the p-well 118 and the p-type substrate 104 when the n-well 108 is depleted between the p-well 118 and the p-buried layer 130. In one example, the p-buried layer 130 has a peak dopant concentration of about $5E15$ $cm^{-3}$ or more and about $5E17$ $cm^{-3}$ or less, wherein the n-buried layer 120 has a peak concentration of about $1E17$ $cm^{-3}$ or more and about $1E20$ $cm^{-3}$ or less, with the n-buried layer peak concentration being higher than that of the p-buried layer 130.

Figure 5A:
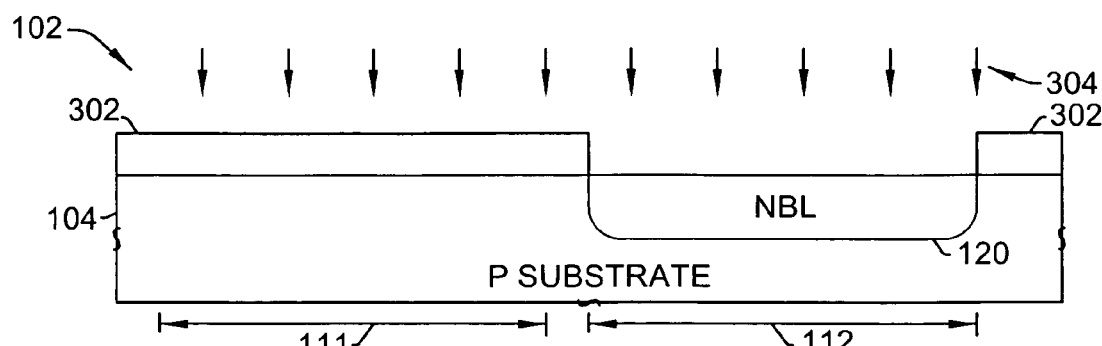
FIGS. 5A–5G are partial side elevation views in section illustrating fabrication of the exemplary device of FIGS. 3A and 3B generally according to the method of FIG. 4.
Figure 5B:
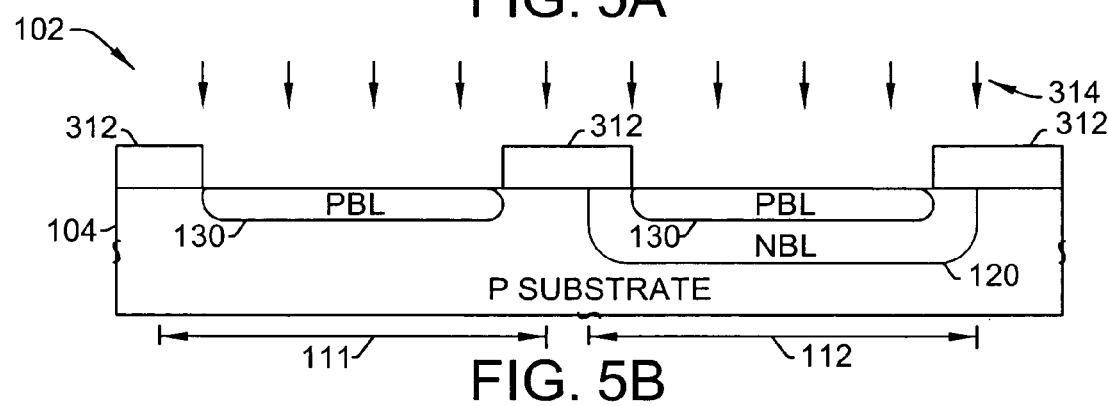
Figure 5C:
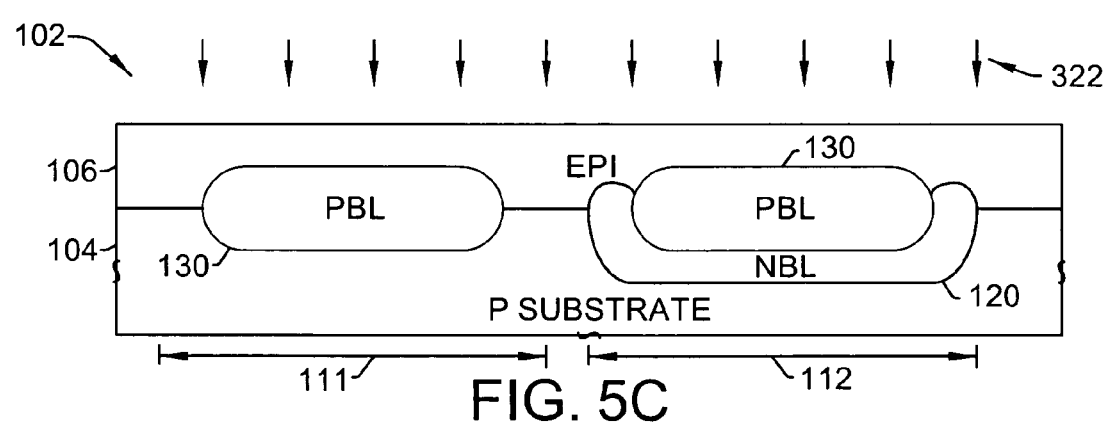
Figure 5D:
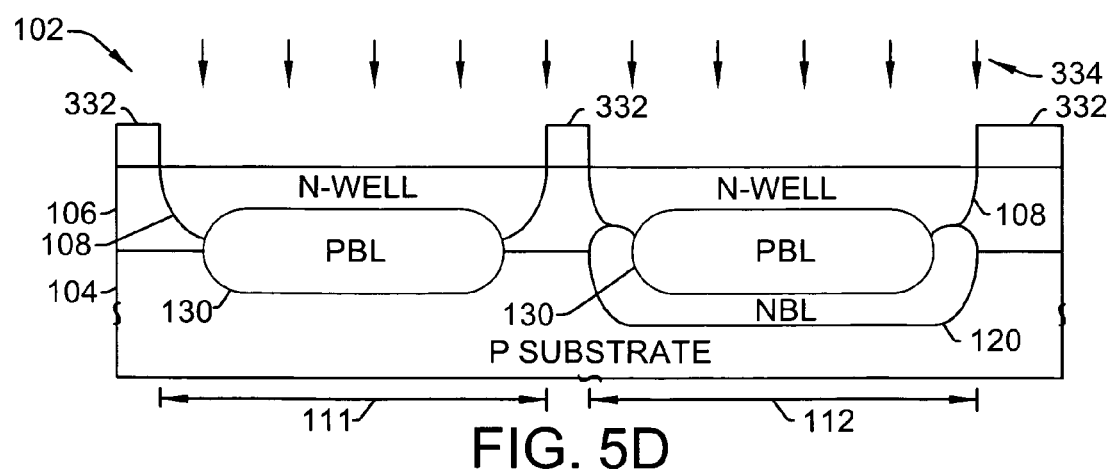

In addition, the heavily doped n-buried layer 120 is preferably coupled to the drain 156 in the high-side device T2, for example, through a deep diffusion (sinker) for connection through later-formed metalization layers (not shown), and/or through joining portions of the n-well 108 and the n-buried layer 120, as illustrated in FIG. 5D below. As such, the n-buried layer 120 is essentially at the supply voltage VCC, wherein the p-buried layer 130 becomes at least partially depleted in the off-state. The presence of the p-buried layer 130 thus affects the field distribution in the off-state, as seen in FIG. 3C, wherein less equipotential line crowding is seen along the edges of the p-well 118 for a higher supply voltage level than was the case in conventional devices (e.g., FIG. 2C above), while the n-buried layer 120 also continues to inhibits p-well to substrate punch-thru current in the on-state.

FIG. 3D provides a graph 160 illustrating drain current (Id) vs. drain-to-source voltage (Vds) curves 162 and 164 for the conventional high-side DENMOS 3 of FIG. 2B and the exemplary high-side DENMOS T2 of FIG. 3B, respectively. As can be seen in the graph 160, the conventional high-side DENMOS 3 of FIG. 2B has a relatively low BVdss 162, while the transistor T3 of FIG. 3B can be safely operated at higher voltages, wherein the breakdown voltage 164 is about 30 percent higher than the conventional device BVdss 162. Thus, the provision of the p-buried layer 130 improves breakdown operation in drain-extended MOS devices, allowing use with higher supply voltages VCC without increasing the thickness of the epitaxial silicon layer 106, and without significant adverse impact on Rdson.

Referring now to FIGS. 4 and 5A–5I, another aspect of the invention provides methods for semiconductor device fabrication, wherein a silicon substrate is provided, and a p-buried layer is implanted therein prior to forming an epitaxial silicon layer over the substrate. A DENMOS transistor is then formed on or in the epitaxial silicon above the p-buried layer. In one implementation illustrated and described further hereinafter, the method further provides for implanting an n-buried layer in the silicon substrate prior to implanting the p-buried layer, such as for forming the exemplary high-side DENMOS driver T2 above.

FIG. 4 illustrates an exemplary method 202 for fabricating a semiconductor device and DENMOS transistors in accordance with the invention, and FIGS. 5A–5G illustrate the exemplary semiconductor device 102 at various stages of fabrication generally in accordance with the method 202 of FIG. 4. Although the exemplary method 202 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of devices which are illustrated and described herein as well as in association with other devices and structures not illustrated.

Beginning at 204 in FIG. 4, the method 202 comprises implanting an n-buried layer (e.g., NBL) at 206 in a substrate, and optionally diffusing the n-buried layer at 208. In the exemplary semiconductor device 102, both low and high side DENMOS transistors T1 and T2, respectively, are provided for use in half or full H-bridge applications, wherein an n-buried layer 120 is provided only for the high-side device T2. FIG. 5A illustrates the device 102 at an early stage of fabrication processing, wherein an NBL implant mask 302 is formed to expose a portion of the upper surface of the substrate 104 in a prospective high-side driver region 112 while covering a prospective low-side driver region 111. An implantation process 304 is then performed with the mask 302 in place to implant n-type dopants (e.g., phosphorus, arsenic, etc.) into the exposed portions of the substrate 104, thereby forming the n-buried layer 120. A diffusion anneal (not shown) may then be performed at 208 to drive the n-type dopants further into the substrate 104, thereby extending the n-buried layer 120 downward and laterally outward from the initial implanted region.

The method 202 proceeds at 210, whereat a p-buried layer (e.g., PBL 130 in the device 102) is implanted, followed by an optional diffusion anneal at 212. In FIG. 5B, a mask 312 is formed, which exposes portions of the n-buried layer 120 in the prospective high-side region 112, as well as a portion of the prospective low-side region 111. An implantation process 314 is then performed with the mask 312 in place, to implant p-type dopants (e.g., boron, etc.) into the exposed portions of the substrate. As illustrated in FIG. 5B, the exemplary p-buried layer 130 in the high-side region 112 is located within the n-buried layer 120 in the device 102, wherein another diffusion anneal may optionally be performed at 212 to drive the implanted p-type dopants laterally and downward, thereby extending the p-buried layer 130.

Following the p-buried layer formation at 210 and 212, an epitaxial growth process is performed at 214 to form an epitaxial silicon layer 106 over the substrate 104. Any suitable epitaxial growth processing may be employed at 214 by which an epitaxial silicon layer 106 is formed over the upper surface of the substrate 104. In FIG. 5C, an epitaxial silicon layer 106 is formed over the substrate 104 using a process 322, wherein thermal energy associated with the epitaxial growth process 322 causes upward diffusion of a portion of the p-type dopants of the p-buried layer 130, whereby a portion of the p-buried layer 130 extends into the epitaxial silicon 106. Similarly, end portions of the exemplary n-buried layer 120 may diffuse upward into the epitaxial silicon 106. However, the p-buried layer 130 generally operates to prevent or inhibit upward diffusion of at least a portion of the n-buried layer in the high-side driver region 112, both during the epitaxial process 322 at 214 and afterwards.

At 216, n-wells are implanted in the epitaxial silicon 106 in the low and high-side regions 111 and 112, respectively, which may then be thermally diffused at 218. In FIG. 5D, a mask 332 is formed to expose all or portions of the prospective DENMOS regions 111 and 112, and an implantation process 334 is performed to provide n-type dopants to the exposed portions of the epitaxial layer 106, thereby forming the n-well 108. Thermal diffusion annealing may be employed at 218 to drive the ends of the implanted n-well 108 and those of the n-buried layer 120 together in the high-side region 112, wherein the p-buried layer 130 again operates to inhibit upward diffusion of the remainder of the n-buried layer 120, and also limits the downward diffusion of n-type dopants from the n-well 108.

Figure 5E:
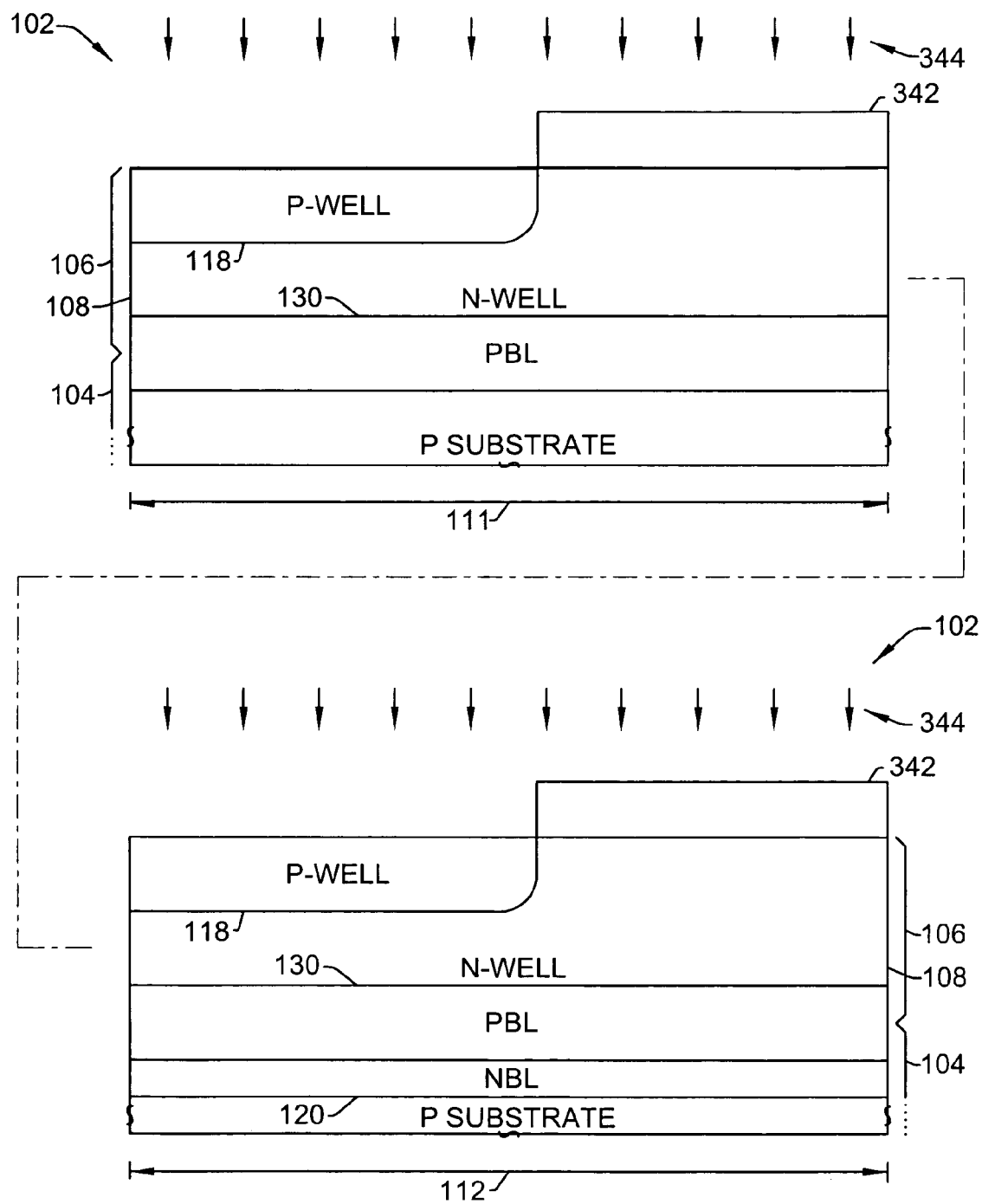

At 220, p-wells or p-base regions 118 are implanted into portions of the n-wells 108. FIG. 5E illustrates further details of the low and high-side DENMOS regions 111 and 112, respectively, in the exemplary device 102, wherein a mask 342 is formed to expose prospective p-well regions of the epitaxial layer 106 in the n-wells 108, while covering other portions of the device 102. An implantation process 344 is then performed with the mask 342 in place, to provide p-type dopants into the exposed portions of the layer 108, thereby creating the p-wells 118, wherein the n-wells 108 extend beneath the p-wells 118 between the p-wells 118 and the p-buried layers 130.

Any suitable implantation processes may be employed in forming the buried layers 120, 130, and the wells 108, 118 within the scope of the invention, with dedicated diffusion anneals optionally being performed following any, all, or none of the implants. In addition, deep n-type diffusions or sinkers (not shown) may be formed to connect the n-buried layers 120 to the upper surface of the device 102 for connection with the high-side device drain using metalization interconnect routing structures (not shown), either alone or in combination with overlapping of the ends of the n-well 108 and the n-buried layer 120 in the high-side driver region 112, wherein all such variant implementations are contemplated as falling within the scope of the invention and the appended claims.

Figure 5F:
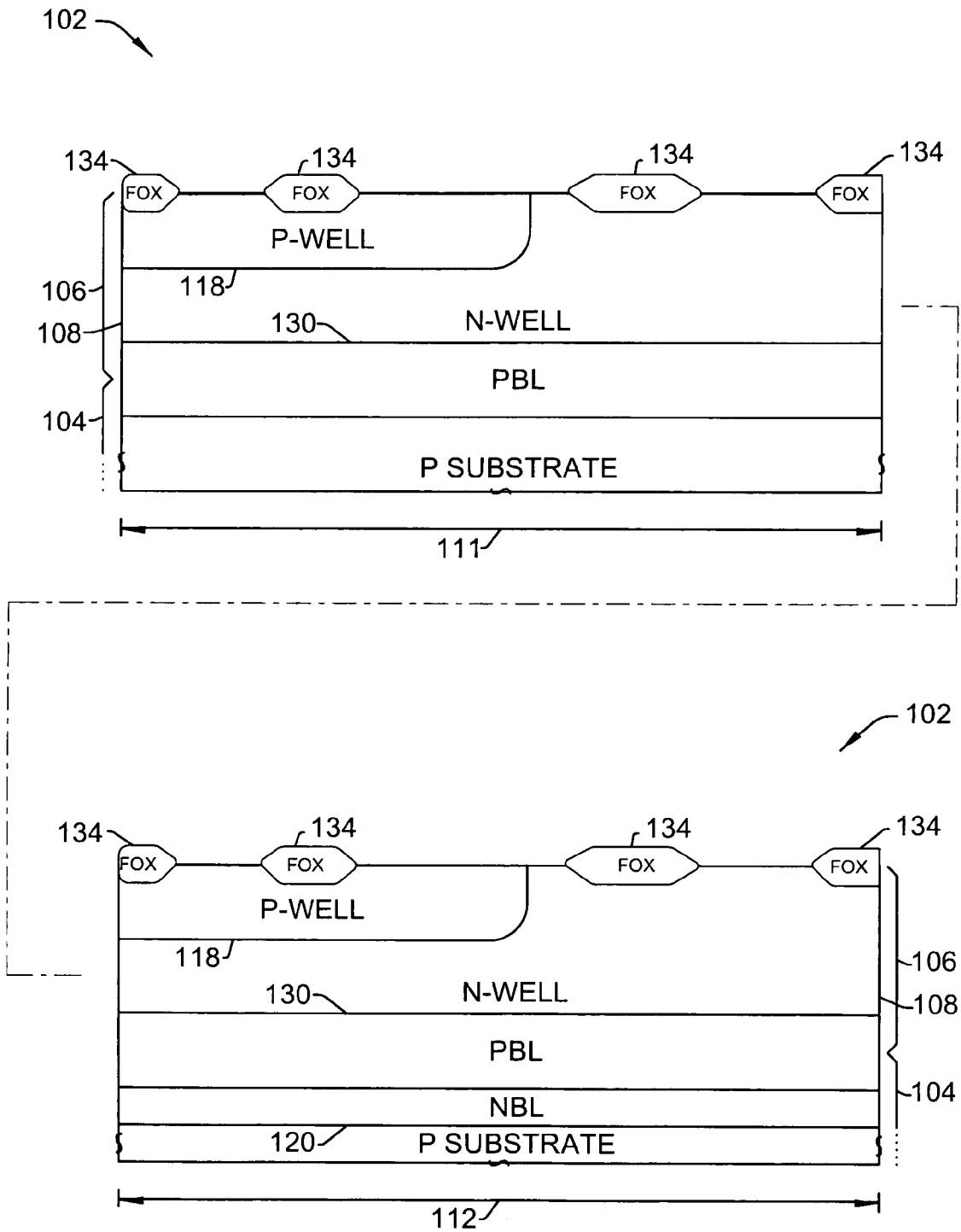
Figure 5G:
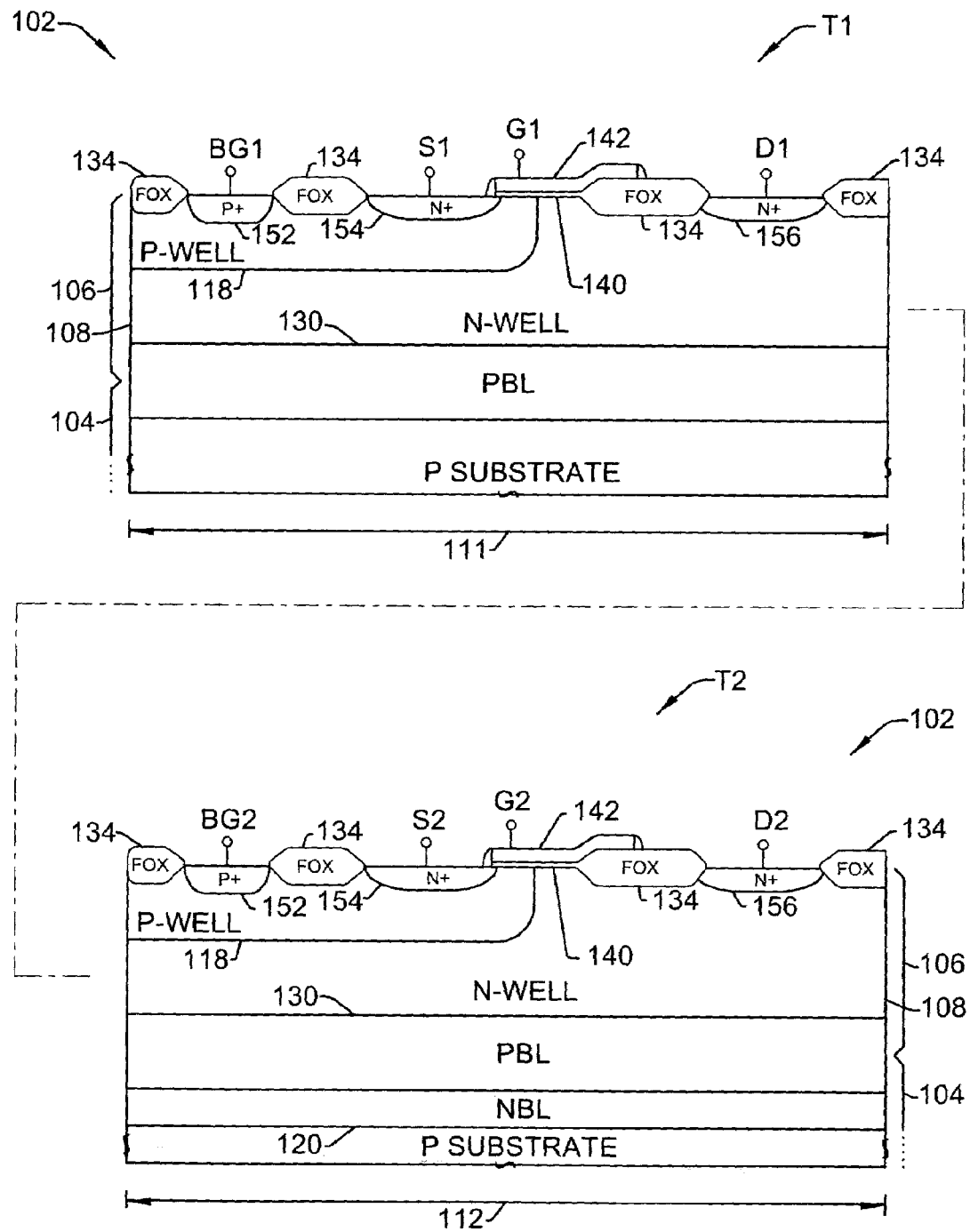

At 222 in FIG. 4, isolation structures 134 are formed using any suitable techniques, such as local oxidation of silicon (LOCOS), shallow trench isolation techniques (STI), deposited oxide, etc. In the exemplary device 102, field oxide (FOX) structures 134 are formed for both the low and high side regions 111 and 112, respectively, as illustrated in FIG. 5F. A thin gate oxide 140 is formed at 224 over the device upper surface, for example, by thermal oxidation processing, and a gate polysilicon layer 142 is deposited at 226 over the thin gate oxide 140. The thin gate oxide 140 and the polysilicon 142 are then patterned at 228 to form gate structures extending over channel regions of the p-wells 118 for the low and high-side DENMOS devices T1 and T2, respectively, as illustrated in FIG. 5G. Sidewall spacers are formed at 230 along the lateral sidewalls of the patterned gate structures, after which the source and drain regions 154 and 156 are implanted with n-type dopants at 232, and the back gate 152 is implanted with p-type dopants at 234, wherein any suitable masks and implantation processes may be used in forming the n-type source 154 and drain 156 and the p-type back gate 152. Thereafter, and further source/drain and/or back gate implantations (not shown) may thereafter be performed with the sidewall spacers in place. Silicide, metalization, and other back-end processing are then performed at 236 and 238, respectively, whereafter the method 202 ends at 240.

Although the invention has been illustrated and described with respect to one or more implementations, alterations and/or modifications may be made to the illustrated examples without departing from the spirit and scope of the appended claims. In particular, while illustrated and described above in the context of n-channel devices, PMOS implementations are also possible, with p-type regions being substituted for n-type regions, and vice versa. In one example, a p-channel drain-extended MOS transistor can be created using an n-type semiconductor body, comprising a p-type source and a p-type drain formed in a semiconductor body, where the drain is laterally spaced from the source, a p-type drift region between the drain and the source, an n-type channel region extending between the drift region and the source in the semiconductor body with the drift region extending between the channel region and the drain, and a gate located above the channel region. The p-channel device further comprises two buried layers, such as an n-buried layer located below the source, the channel region, and the drift region, and a p-buried layer of the located below the first buried layer. With regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device, the method comprising:

providing a silicon substrate;

implanting an n+ buried layer in the silicon substrate;

implanting a p− buried layer in the silicon substrate wherein the n+ buried layer contacts the p− buried layer on only one side;

forming a p-type epitaxial silicon layer over the silicon substrate after implanting the p− buried layer;

forming an n-well in the epitaxial silicon layer wherein a portion of the n-well contacts the p− buried layer; and forming a drain-extended NMOS transistor above the p− buried layer in the n-well of the epitaxial silicon layer.

* * * * *